United States Patent
Wang et al.

(10) Patent No.: US 11,914,432 B2
(45) Date of Patent: Feb. 27, 2024

(54) PORTABLE ELECTRONIC DEVICE

(71) Applicant: Acer Incorporated, New Taipei (TW)

(72) Inventors: Chun-Chieh Wang, New Taipei (TW);
Wen-Neng Liao, New Taipei (TW);
Cheng-Wen Hsieh, New Taipei (TW);
Chuan-Hua Wang, New Taipei (TW);
Yi-Ta Huang, New Taipei (TW)

(73) Assignee: Acer Incorporated, New Taipei (TW)

( * ) Notice: Subject to any disclaimer, the term of this patent is extended or adjusted under 35 U.S.C. 154(b) by 0 days.

(21) Appl. No.: 17/724,453

(22) Filed: Apr. 19, 2022

(65) Prior Publication Data

US 2022/0342455 A1  Oct. 27, 2022

(30) Foreign Application Priority Data

Apr. 21, 2021 (TW) ................... 110114281

(51) Int. Cl.
*G06F 1/16* (2006.01)
*H05K 7/20* (2006.01)

(52) U.S. Cl.
CPC ......... *G06F 1/1681* (2013.01); *H05K 7/2039* (2013.01)

(58) Field of Classification Search
None
See application file for complete search history.

(56) References Cited

U.S. PATENT DOCUMENTS

| | | | | |
|---|---|---|---|---|
| 8,917,498 | B2* | 12/2014 | Mai | G06F 1/1616 |
| | | | | 361/679.08 |
| 9,891,667 | B2* | 2/2018 | Jung | G06F 1/1633 |
| 10,401,926 | B1* | 9/2019 | North | G06F 1/1618 |
| 10,534,408 | B2* | 1/2020 | Cheng | G06F 1/1616 |
| 10,860,067 | B2* | 12/2020 | Sharma | G06F 1/1662 |
| 10,901,468 | B2* | 1/2021 | Xia | H04M 1/0218 |
| 11,079,809 | B2* | 8/2021 | Morino | G06F 1/1616 |
| 2012/0275099 | A1* | 11/2012 | Yamami | H04M 1/0208 |
| | | | | 361/679.01 |
| 2015/0331451 | A1* | 11/2015 | Shin | G06F 1/1626 |
| | | | | 345/173 |
| 2019/0041922 | A1* | 2/2019 | Kurma Raju | G06F 1/1637 |
| 2019/0354148 | A1 | 11/2019 | Delano et al. | |
| 2020/0142456 | A1* | 5/2020 | Hsu | G06F 1/203 |

FOREIGN PATENT DOCUMENTS

| | | |
|---|---|---|
| CN | 1188269 | 7/1998 |
| CN | 201072524 | 6/2008 |
| TW | I541637 | 7/2016 |
| TW | M565816 | 8/2018 |
| TW | I669597 | 8/2019 |

* cited by examiner

*Primary Examiner* — Anthony Q Edwards
*Assistant Examiner* — Rashen E Morrison
(74) *Attorney, Agent, or Firm* — JCIPRNET

(57) ABSTRACT

A portable electronic device including a first body, a second body, a pivot element, a heat source, a first flexible heat conductive element, and a flip cover is provided. The pivot element is connected to the second body, and the second body is pivotally connected to the first body through the pivot element. The heat source is disposed in the first body. The first flexible heat conductive element is thermally coupled to the heat source and extends toward the pivot element from the heat source. The first flexible heat conductive element passes through the pivot element and extends into the inside of the second body and is thus thermally coupled to the second body. The flip cover is pivotally connected to the first body and located on a moving path of the pivot element.

7 Claims, 3 Drawing Sheets

PORTABLE ELECTRONIC DEVICE

CROSS-REFERENCE TO RELATED APPLICATION

This application claims the priority benefit of Taiwan application serial no. 110114281, filed on Apr. 21, 2021. The entirety of the above-mentioned patent application is hereby incorporated by reference herein and made a part of this specification.

BACKGROUND

Technical Field

The disclosure relates to an electronic device and particularly relates to a portable electronic device.

Description of Related Art

Common portable electronic devices include smart phones, tablet PCs, and notebook computers. Since these portable electronic devices may be easily carried by users to send, receive, and process information in real time, these devices have become indispensable tools for modern people.

The notebook computer is taken as an example. As the amount of data computation increases, a significant amount of heat is generated during operation of the notebook computer. As to configurations of the notebook computer, the main heat source is a central processing unit (CPU), a graphics processing unit (GPU), or other electronic elements, and the CPU, the GPU, or other electronic elements are disposed in a host. Subject to the appearance design of the host, most of the heat generated by the heat source is guided to the bottom or the side of the host and then dissipated. However, the heat dissipation design on the bottom or the side of the host may be easily blocked by surrounding objects, or there may exist an issue of insufficient heat dissipation area, thus resulting in poor heat dissipation efficiency.

SUMMARY

The disclosure provides a portable electronic device with favorable heat dissipation efficiency.

According to an embodiment of the disclosure, a portable electronic device includes a first body, a second body, a pivot element, a heat source, a first flexible heat conductive element, and a flip cover. The pivot element is connected to the second body, and the second body is pivotally connected to the first body through the pivot element. The heat source is disposed in the first body. The first flexible heat conductive element is thermally coupled to the heat source and extends toward the pivot element from the heat source. The first flexible heat conductive element passes through the pivot element and extends to an inside of the second body and thus is thermally coupled to the second body. The flip cover is pivotally connected to the first body and located on a moving path of the pivot element.

In view of the foregoing, in the portable electronic device provided in one or more embodiments of the disclosure, the heat generated by the heat source may be transmitted to the second body through the first flexible heat conductive element, so that the heat may be dissipated from the second body to the outside. Since the second body may provide a large heat dissipation area, the portable electronic device provided in one or more embodiments of the disclosure has favorable heat dissipation efficiency.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
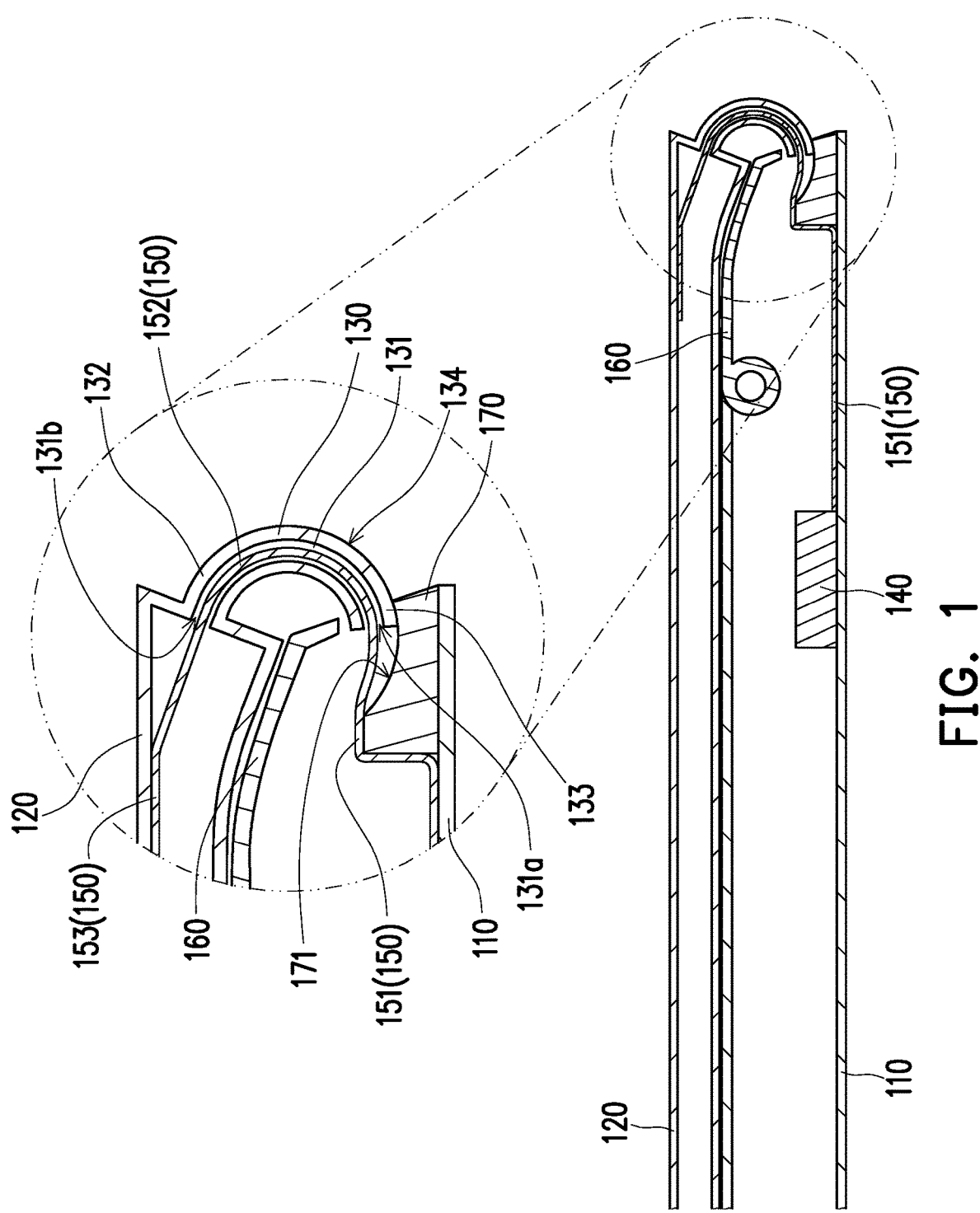
FIG. 1 is a schematic partial cross-sectional view of a portable electronic device in a first state according to an embodiment of the disclosure.
Figure 2:
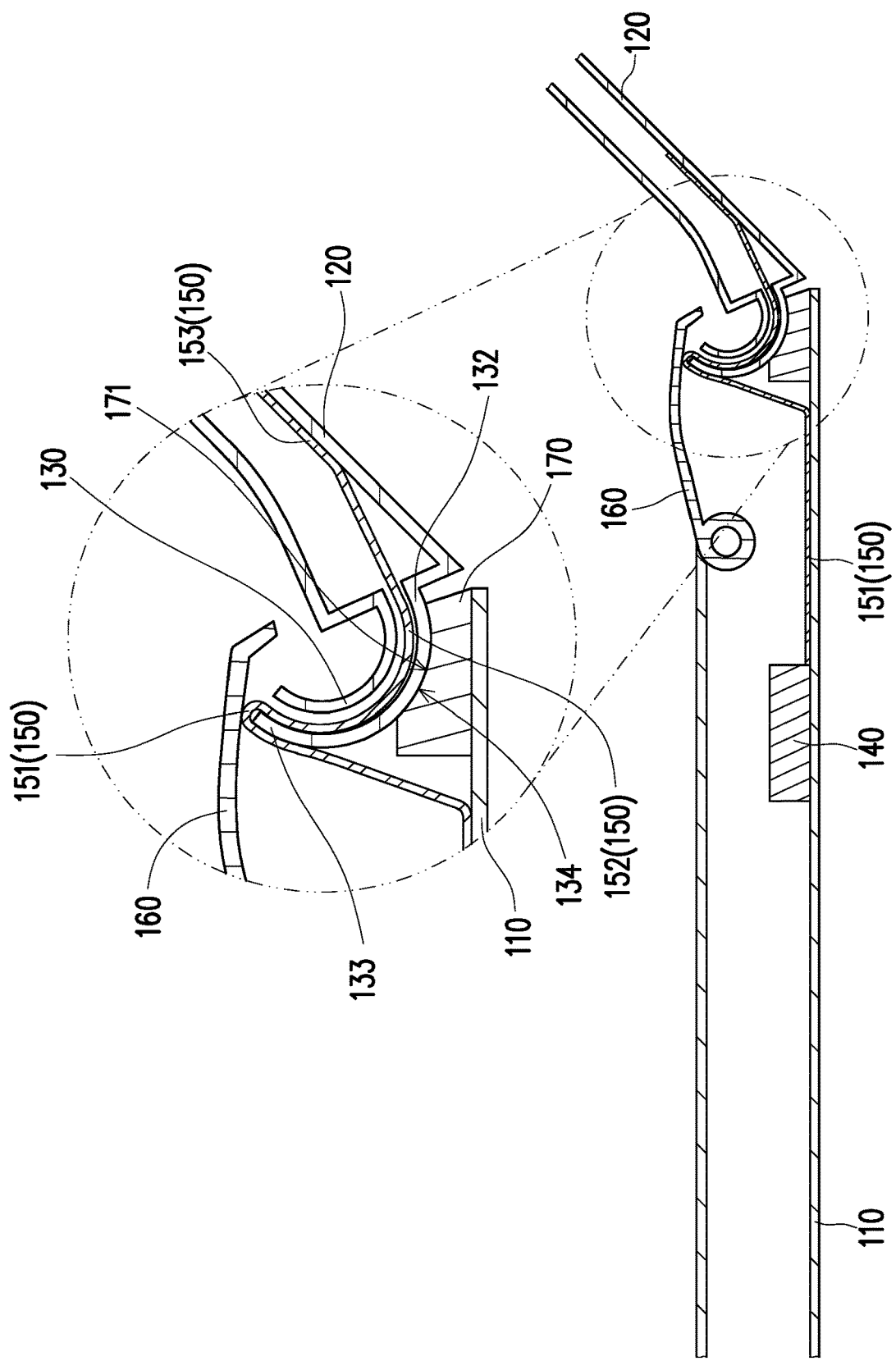
FIG. 2 is a schematic partial cross-sectional view of a portable electronic device in a second state according to an embodiment of the disclosure.

FIG. 1 is a schematic partial cross-sectional view of a portable electronic device in a first state according to an embodiment of the disclosure. FIG. 2 is a schematic partial cross-sectional view of a portable electronic device in a second state according to an embodiment of the disclosure. With reference to FIG. 1 and FIG. 2, in this embodiment, the portable electronic device 100 may be a notebook computer, which includes a first body 110, a second body 120, a pivot element 130, a heat source 140, a first flexible heat conductive element 150, and a flip cover 160.

The first body 110 and the second body 120 are electrically connected, wherein the first body 110 may be configured to perform logic calculations, data access, and signal control, and the second body 120 may be a display. The second body 120 is pivotally connected to the first body 110, so as to be opened and closed relative to the first body 110. To be specific, the pivot element 130 is connected to the second body 120, and the second body 120 is pivotally connected to the first body 110 through the pivot element 130. The pivot element 130 is at least partially located in the first body 110 and has a degree of freedom of sliding and rotating motions relative to the first body 110.

The heat source 140 is disposed in the first body 110, wherein the heat source 140 may be a CPU, a GPU, or other electronic elements, and the heat generated by the heat source 140 may be transmitted to the second body 120 through the pivot element 130. In detail, the first flexible heat conductive element 150 is thermally coupled to the heat source 140, wherein the first flexible heat conductive element 150 may be a wire or a sheet made of copper, aluminum, graphite, or other materials with high thermal conductivity, and the first flexible heat conductive element 150 is adapted to be bent upon receipt of a force and is not easily fractured.

One end of the first flexible heat conductive element 150 is connected to the heat source 140 and extends toward the pivot element 130 from the heat source 140. The first flexible heat conductive element 150 then passes through the pivot element 130 and extends to the inside of the second body 120. The other end of the first flexible heat conductive element 150 is connected to the second body 120 to be thermally coupled to the second body 120. Hence, the heat generated by the heat source 140 may be transmitted to the second body 120 through the first flexible heat conductive element 150, so that the heat may be dissipated from the second body 120 to the outside. Since the second body 120 may provide a large heat dissipation area, the portable electronic device 100 has favorable heat dissipation efficiency.

The flip cover 160 is pivotally connected to the first body 110, and the flip cover 160 is located on a moving path of the pivot element 130. In a first state, the second body 120 covers the first body 110 and the flip cover 160. In a second state, the second body 120 is unfolded relative to the first body 110, and the pivot element 130 touches and pushes the flip cover 160, so that the flip cover 160 is lifted relative to the first body 110. At this time, the heat generated by the heat source 140 may be dissipated to the outside through a gap between the flip cover 160 and the first body 110, which is conducive to the improvement of the heat dissipation efficiency of the portable electronic device 100.

In this embodiment, the pivot element 130 has a passage 131, wherein the passage 131 has a first terminal port 131a and a second terminal port 131b opposite to the first terminal port 131a. The first terminal port 131a communicates with the inside of the first body 110, and the second terminal port 131b communicates with the inside of the second body 120. The first flexible heat conductive element 150 extends toward the first terminal port 131a from the heat source 140 and penetrates the passage 131 from the first terminal port 131a. The first flexible heat conductive element 150 then passes through the passage 131 from the second terminal port 131b and extends to the inside of the second body 120.

The first flexible heat conductive element 150 includes a first segment 151, a second segment 152 connected to the first segment 151, and a third segment 153 connected to the second segment 152, wherein the first segment 151 is disposed in the first body 110 and thermally coupled to the heat source 140. The second segment 152 is disposed in the passage 131, and the third segment 153 is disposed in the second body 120 and thermally coupled to the second body 120. Particularly, the first segment 151 is partially located between the flip cover 160 and the pivot element 130. In the second state, the pivot element 130 contacts the flip cover 160 through the first segment 151. In other words, a part of the first flexible heat conductive element 150 is clamped between the flip cover 160 and the pivot element 130. Hence, the heat transmitted to the first flexible heat conductive element 150 may also be transmitted to the flip cover 160 to be dissipated to the outside from the flip cover 160.

In this embodiment, the pivot element 130 includes a fixing end 132 and a driving end 133 opposite to the fixing end 132, wherein the fixing end 132 is fixed to the second body 120, and the second terminal port 131b is located at the fixing end 132. The driving end 133 is pivotally connected to the first body 110, wherein the first terminal port 131a is located at the driving end 133, and the driving end 133 has the degree of freedom of sliding and rotating motions relative to the first body 110.

The flip cover 160 is located on a moving path of the driving end 133, and the driving end 133 is configured to push and lift the flip cover 160, as shown in FIG. 2. In the second state, a part of the first flexible heat conductive element 150 is clamped between the driving end 133 and the flip cover 160. In other words, the driving end 133 contacts the flip cover 160 through the first flexible heat conductive element 150.

With reference to FIG. 1 and FIG. 2, the portable electronic device 100 further includes a guiding structure 170 that is disposed in the first body 110 and corresponds to the flip cover 160. To be specific, the pivot element 130 is slidably connected to the guiding structure 170 and located between the flip cover 160 and the guiding structure 170. When the second body 120 rotates relative to the first body 110, the pivot element 130 is guided by the guiding structure 170, so that the driving end 133 moves toward or away from the flip cover 160.

For instance, the pivot element 130 has a convex-arc surface 134 facing the guiding structure 170, and the guiding structure 170 has a concave-arc surface 171 facing the flip cover 160. At least a part of the convex-arc surface 134 is in contact with the concave-arc surface 171, and the geometric contour of the concave-arc surface 171 is complementary to the geometric contour of the convex-arc surface 134 to improve smoothness and stability of the pivot element 130 when the pivot element 130 slides relative to the guiding structure 170.

Figure 3:
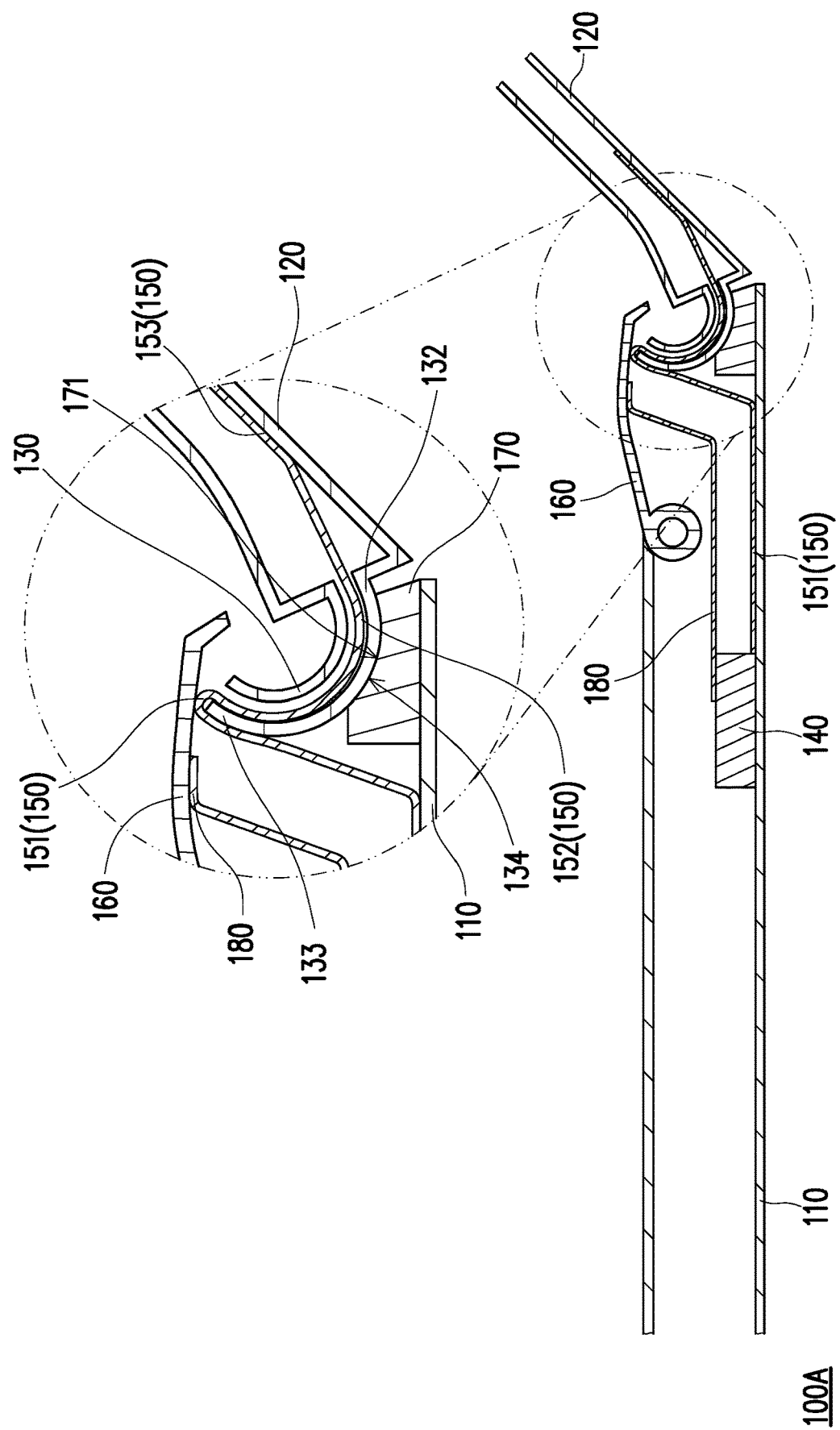
FIG. 3 is a schematic partial cross-sectional view of a portable electronic device in a second state according to another embodiment of the disclosure.

FIG. 3 is a schematic partial cross-sectional view of a portable electronic device in a second state according to another embodiment of the disclosure. With reference to FIG. 3, the design principle of a portable electronic device 100A provided in this embodiment is substantially the same as the design principle of the portable electronic device 100 provided in the previous embodiment, while the difference between the two lies in that the portable electronic device 100A provided in this embodiment further includes a second flexible heat conductive element 180 thermally coupled to the heat source 140; the second flexible heat conductive element 180 may be a wire or a sheet made of copper, aluminum, graphite, or other materials with high thermal conductivity and is adapted to be bent upon receipt of a force and is not easily fractured.

Particularly, the second flexible heat conductive element 180 is disposed in the first body 110, wherein one end of the second flexible heat conductive element 180 is connected to the heat source 140 and thermally coupled to the heat source 140. The other end of the second flexible heat conductive element 180 is connected to and thermally coupled to the flip cover 160. Hence, the heat generated by the heat source 140 may be transmitted to the flip cover 160 through the second flexible heat conductive element 180, so that the flip cover 160 provides another heat dissipation path and a large heat dissipation area.

To sum up, in the portable electronic device provided in one or more embodiments of the disclosure, the heat generated by the heat source may be transmitted to the second body through the first flexible heat conductive element, so that the heat may be dissipated from the second body to the outside. Since the second body may provide a large heat dissipation area, the portable electronic device provided in one or more embodiments of the disclosure has good heat dissipation efficiency. In another aspect, when the second body is unfolded relative to the first body, the flip cover is lifted relative to the first body, so that the heat generated by the heat source may be dissipated to the outside through the gap between the flip cover and the first body. In some embodiments, the heat generated by the heat source may be transmitted to the flip cover through the second flexible heat conductive element, so as to provide another heat dissipation path and a large heat dissipation area through the flip cover.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A portable electronic device, comprising:
   a first body;
   a second body;
   a pivot element, connected to the second body, the second body being pivotally connected to the first body through the pivot element;
   a heat source, disposed in the first body;
   a first flexible heat conductive element, thermally coupled to the heat source, extending toward the pivot element from the heat source, passing through the pivot element, and extending to an inside of the second body to be thermally coupled to the second body, wherein the first flexible heat conductive element is a wire or a sheet made of materials with high thermal conductivity;
   a flip cover, pivotally connected to the first body and located at a moving path of the pivot element; and
   a second flexible heat conductive element, disposed in the first body and thermally coupled to the heat source and the flip cover.

2. The portable electronic device according to claim 1, wherein the pivot element has a passage communicating with the inside of the second body, the first flexible heat conductive element comprises a first segment, a second segment connected to the first segment, and a third segment connected to the second segment, the first segment is disposed in the first body and thermally coupled to the heat source, the second segment is disposed in the passage, and the third segment is disposed in the second body and thermally coupled to the second body.

3. The portable electronic device according to claim 2, wherein the first segment is partially located between the flip cover and the pivot element, and the pivot element contacts the flip cover through the first segment.

4. The portable electronic device according to claim 1, wherein the pivot element comprises a fixing end and a driving end opposite to the fixing end, the fixing end is fixed to the second body, the driving end is pivotally connected to the first body, the flip cover is located on a moving path of the driving end, and the driving end is configured to push and lift the flip cover.

5. The portable electronic device according to claim 4, wherein the first flexible heat conductive element is partially located between the flip cover and the pivot element, and the driving end contacts the flip cover through the first flexible heat conductive element.

6. The portable electronic device according to claim 1, further comprising:
   a guiding structure, disposed in the first body and corresponding to the flip cover, wherein the pivot element is slidably connected to the guiding structure and located between the flip cover and the guiding structure.

7. The portable electronic device according to claim 6, wherein the pivot element has a convex-arc surface facing the guiding structure, the guiding structure has a concave-arc surface facing the flip cover, and the convex-arc surface at least partially contacts the concave-arc surface.

* * * * *